(12) United States Patent
Lee

(10) Patent No.: US 6,483,359 B2
(45) Date of Patent: Nov. 19, 2002

(54) DELAY LOCKED LOOP FOR USE IN SEMICONDUCTOR MEMORY DEVICE

(75) Inventor: Seong-Hoon Lee, Kyoungki-do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 5 days.

(21) Appl. No.: 09/897,829

(22) Filed: Jun. 29, 2001

(65) Prior Publication Data

US 2002/0015338 A1 Feb. 7, 2002

(30) Foreign Application Priority Data

Jun. 30, 2000 (KR) ........................................ 2000-36762

(51) Int. Cl.[7] ................................................ H03L 7/06
(52) U.S. Cl. ........................ 327/158; 327/156; 327/149
(58) Field of Search ................................ 327/141, 144, 327/146, 147, 149, 156, 158, 269, 270, 271, 276, 277, 284, 393, 395, 396

(56) References Cited

U.S. PATENT DOCUMENTS

| | | | | |
|---|---|---|---|---|
| 5,712,884 A | * | 1/1998 | Jeong | 327/149 |
| 5,901,190 A | | 5/1999 | Lee | 375/373 |
| 6,049,239 A | * | 4/2000 | Eto et al. | 327/158 |
| 6,229,363 B1 | * | 5/2001 | Eto et al. | 327/158 |
| 6,342,796 B2 | * | 1/2002 | Jung | 327/141 |
| 2001/0005337 A1 | | 6/2001 | Jung | 365/230.08 |

FOREIGN PATENT DOCUMENTS

GB          2 331 416          5/1999

* cited by examiner

*Primary Examiner*—Toan Tran
(74) *Attorney, Agent, or Firm*—Marshall, Gerstein & Borun

(57) ABSTRACT

A delay locked loop (DLL) is disclosed which has finer adjustability. The delay locked loop generally includes: a first shift register for controlling a delay amount of an internal clock in response to a first shift-right signal and a first shift-left signal, a first delay line for delaying the internal clock according to an output of the first shift register, wherein the first delay line includes a plurality of first delay units, each first delay unit having a first delay amount; a second shift register for controlling the delay amount of an output of the first delay line in response to a second shift-right signal and a second shift-left signal, which are outputted from the first shift register; and a second delay line for delaying an output of the first delay line by a predetermined delay amount in response to an output of the second shift register, wherein the second delay line includes a plurality of second delay units, each second delay unit having a second delay amount larger than the first delay amount.

80 Claims, 12 Drawing Sheets

$$\tau_D = 3\tau_{FD} + 2\tau_{CD}$$
$$= (2\tau_{FD} + 2\tau_{CD}) + \tau_{FD}$$

$$\tau_D = 3\tau_{CD}$$
$$= (3\tau_{FD} + 2\tau_{CD}) + \tau_{FD}$$

FIG. 5D

| FSL1 | FSL2 | FSL3 | 342 | 343 | 344 | 345 | 346 | 347 | 340 |
|---|---|---|---|---|---|---|---|---|---|
| 1 | 1 | 0 | 1 | 1 | 0 | 1 | 1 | 0 | CLK_IN_D |

| CSL1 | CSL2 | CSL3 | 361 | 362 | 363 | 364 | 365 | 366 | 360 |
|---|---|---|---|---|---|---|---|---|---|
| 0 | 1 | 0 | 1 | CLK_IN_D | 1 | $\overline{\text{CLK\_IN\_D}}$ | CLK_IN_D | 1 | CLK_IN_D |

FIG. 5E

| FSL1 | FSL2 | FSL3 | 342 | 343 | 344 | 345 | 346 | 347 | 340 |
|---|---|---|---|---|---|---|---|---|---|
| 1 | 1 | 1 | 1 | 1 | 1 | 1 | 1 | 1 | CLK_IN_D |

| CSL1 | CSL2 | CSL3 | 361 | 362 | 363 | 364 | 365 | 366 | 360 |
|---|---|---|---|---|---|---|---|---|---|
| 0 | 1 | 0 | 1 | CLK_IN_D | 1 | $\overline{\text{CLK\_IN\_D}}$ | CLK_IN_D | 1 | CLK_IN_D |

FIG. 5F

| FSL1 | FSL2 | FSL3 | 342 | 343 | 344 | 345 | 346 | 347 | 340 |
|---|---|---|---|---|---|---|---|---|---|
| 0 | 0 | 0 | 0 | 0 | 0 | 0 | 0 | 0 | CLK_IN_D |

| CSL1 | CSL2 | CSL3 | 361 | 362 | 363 | 364 | 365 | 366 | 360 |
|---|---|---|---|---|---|---|---|---|---|
| 0 | 0 | 1 | 1 | 1 | $\overline{\text{CLK\_IN\_D}}$ | $\overline{\text{CLK\_IN\_D}}$ | $\overline{\text{CLK\_IN\_D}}$ | $\overline{\text{CLK\_IN\_D}}$ | CLK_IN_D |

FIG. 6D

| FSL1 | FSL2 | FSL3 | 342 | 343 | 344 | 345 | 346 | 347 | 340 |
|---|---|---|---|---|---|---|---|---|---|
| 1 | 0 | 0 | 1 | 0 | 0 | 1 | 0 | 0 | CLK_IN_D |

| CSL1 | CSL2 | CSL3 | 361 | 362 | 363 | 364 | 365 | 366 | 360 |
|---|---|---|---|---|---|---|---|---|---|
| 0 | 1 | 0 | 1 | CLK_IN_D | 1 | $\overline{\text{CLK\_IN\_D}}$ | CLK_IN_D | 1 | CLK_IN_D |

FIG. 6E

| FSL1 | FSL2 | FSL3 | 342 | 343 | 344 | 345 | 346 | 347 | 340 |
|---|---|---|---|---|---|---|---|---|---|
| 0 | 0 | 0 | 0 | 0 | 0 | 0 | 0 | 0 | CLK_IN_D |

| CSL1 | CSL2 | CSL3 | 361 | 362 | 363 | 364 | 365 | 366 | 360 |
|---|---|---|---|---|---|---|---|---|---|
| 0 | 1 | 0 | 1 | $\overline{\text{CLK\_IN\_D}}$ | 1 | $\overline{\text{CLK\_IN\_D}}$ | CLK_IN_D | 1 | CLK_IN_D |

FIG. 6F

| FSL1 | FSL2 | FSL3 | 342 | 343 | 344 | 345 | 346 | 347 | 340 |
|---|---|---|---|---|---|---|---|---|---|
| 1 | 1 | 1 | 1 | 1 | 1 | 1 | 1 | 1 | CLK_IN_D |

| CSL1 | CSL2 | CSL3 | 361 | 362 | 363 | 364 | 365 | 366 | 360 |
|---|---|---|---|---|---|---|---|---|---|
| 1 | 0 | 0 | $\overline{\text{CLK\_IN\_D}}$ | 1 | 1 | $\overline{\text{CLK\_IN\_D}}$ | 1 | 1 | CLK_IN_D |

DELAY LOCKED LOOP FOR USE IN SEMICONDUCTOR MEMORY DEVICE

FIELD OF THE INVENTION

The present invention relates to a semiconductor memory device; and, more particularly, to a delay locked loop with finer adjustability and, thus, reduced jitter.

BACKGROUND OF THE INVENTION

For achieving a high-speed operation in a semiconductor memory device, a synchronous dynamic random access memory (SDRAM) has been developed. The SDRAM operates in synchronization with an external clock signal. The SDRAM includes a single data rate (SDR) SDRAM, a double data rate (DDR) SDRAM, and the like.

Generally, when data are outputted in synchronization with the external clock signal, a skew occurs between the external clock signal and the output data. In the SDRAM, a delay locked loop (DLL) can be used to compensate for the skew that occurs between either an external clock signal and an output data, or an external clock signal and an internal clock signal.

FIG. 1 is a block diagram of a conventional DLL. Referring to FIG. 1, the illustrated conventional DLL includes a clock buffer 100, a delay monitor 110, a phase detector 120, a shift register 130 and a digital delay line 140.

The clock buffer 100 receives an external clock EXT_CLK to generate an internal clock CLK_IN. The delay monitor 110 receives a DLL clock DLL_CLK, i.e., an output of the DLL, to perform a monitoring operation and to add a predetermined amount of delay for determining a delay amount of the internal clock CLK_IN. An output of the delay monitor 110 is fed back to the phase detector 120.

The phase detector 120 compares a phase difference between the internal clock CLK_IN and the output of the delay monitor 110 to generate either a shift-left signal SHF_L or a shift-right signal SHF_R as a control signal depending on whether less or more delay is desired.

The shift register 130 decreases the delay amount in response to the shift-left signal SHF_L and increases the delay amount in response to the shift-right signal SHF_R. The digital delay line 140 delays the internal clock CLK_IN according to an output of the shift register 130 to generate the DLL clock DLL_CLK.

In FIG. 2, there is shown an exemplary diagram of the digital delay line having three delay units, generally shown as 230, 231, and 232. As shown in FIG. 2, the illustrated digital delay line 140 includes a control unit 200 for transferring the internal clock CLK_IN through a number of the delay units 230, 231, 232 in response to a first, a second, and a third shift control signals, generally shown as SL1, SL2, and SL3, respectively. The digital delay line 140 also includes a delay unit 210 for performing a time delay operation under control of the control unit 200. The digital delay line 140 further includes an output unit 220 for receiving an output of the delay unit 210 to generate the DLL clock DLL_CLK.

When only the first shift control signal SL1 is a logic high, the digital delay line 140 generates the DLL clock DLL_CLK obtained by delaying the internal clock CLK_IN through only a first delay unit 230. Then, the DLL clock DLL_CLK is transferred to the phase detector 120 through the delay monitor 110, and the phase detector 120 compares a phase of the DLL clock DLL_CLK and that of the internal clock CLK_IN.

If the internal clock CLK_IN needs further delay, the phase detector 120 activates the shift-right signal SHF_R. As a result, the first and the second shift control signals SL1 and SL2 are set to a logic low and a logic high, respectively. That is, the logic high is shifted in a right direction from SL1 to SL2.

Then, the digital delay line 140 generates the DLL clock DLL_CLK obtained by delaying the internal clock CLK_IN by two delay units 230 and 231. The DLL clock DLL_CLK is again fed back to the phase detector 120 through the delay monitor 110.

Meanwhile, if it is needed to delay the internal clock CLK_IN less, the phase detector 120 activates the shift-left signal SHF_L. As a result, the logic high signal is shifted in a left direction.

However, since each delay unit contained in the conventional digital delay line 140 is implemented with two NAND gates, the conventional DLL can make only relatively large, coarse adjustments, for example, adjustments of about several picoseconds. Therefore, as the semiconductor memory device operates at a faster speed, there is a need for a DLL with finer adjustability.

BRIEF DESCRIPTION OF THE DRAWINGS

Objects and features of the disclosed device and method will become apparent from the following description of the preferred embodiments with reference to the accompanying drawings, in which:

FIGS. 5D, 5E, and 5F are truth tables corresponding to the circuit diagrams illustrated in FIGS. 5A, 5B, and 5C;

FIGS. 6D, 6E, and 6F are truth tables corresponding to the circuit diagrams illustrated in FIGS. 6A, 6B, and 6C.

DETAILED DESCRIPTION OF THE PREFERRED EMBODIMENTS

Figure 3:
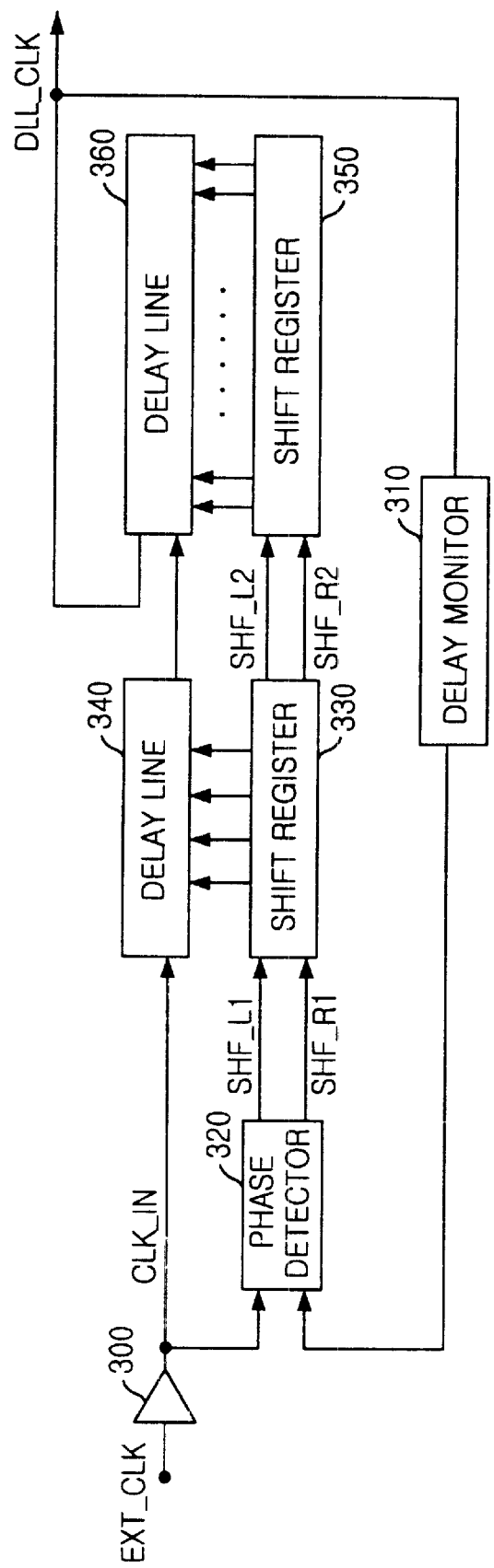
FIG. 3 is a block diagram illustrating an exemplary DLL constructed in accordance with the teachings of the disclosed invention.

Referring to FIG. 3, the disclosed delay locked loop (DLL) generally includes a clock buffer 300, a delay monitor 310, a phase detector 320, a first shift register 330, a first delay line 340, a second shift register 350 and a second delay line 360.

The clock buffer 300 receives an external clock EXT_CLK to generate an internal clock CLK_IN. The delay monitor 310 receives a DLL clock DLL_CLK, i.e., an output of the DLL, to perform a monitoring operation for determining a delay amount of the internal clock CLK_IN. An output of the delay monitor 310 is fed back to the phase detector 320.

The phase detector 320 compares a phase difference between the internal clock CLK_IN and the output of the delay monitor 310 to generate one of a first shift-left signal SHF_L1 and a first shift-right signal SHF_R1 depending on whether less or more delay is required.

The first shift register 330 decreases the delay amount of the internal clock CLK_IN in response to the first shift-left signal SHF_L1 and increases that delay amount in response to the first shift-right signal SHF_R1. For example, the initial state of the output of the first shift register 330 to the first delay line 340 is a logic combination of 000. If the phase detector 320 generates a first shift-left signal SHF_L1 then the output of the first shift register 330 becomes a logic combination of 111 from a logic combination of 000 and at the same time the first shift register 330 generates a second shift-left signal SHF_L2. However, if the phase detector 320 generates a first shift-right signal SHF_R1 then the output of the first shift register 330 becomes a logic combination of 100 from a logic combination of 000. In another example, if when the output of the first shift register 330 is a logic combination of 110, the phase detector 320 generates a first shift-right signal SHF_R1 then the output of the first shift register 330 becomes a logic combination of 111 from a logic combination of 110. Furthermore, if the phase detector 320 generates another first shift-right signal SHF_R1 then the output of the first shift register 330 becomes a logic combination of 000 from a logic combination of 111 and at the same time the first shift register 330 generates a second shift-right signal SHF_R2 . However, if the phase detector 320 generates a first shift-left signal SHF_L1 instead of a first shift-right SHF_R1 when the output of the first shift register 330 has a logic combination of 111 then the output of the first shift register 330 returns to a logic combination of 110 from a logic combination of 111.

The first delay line 340 delays the internal clock CLK_IN according to an output of the first shift register 330. The first delay line 340 includes a plurality of delay units having a small delay amount.

Figure 1:
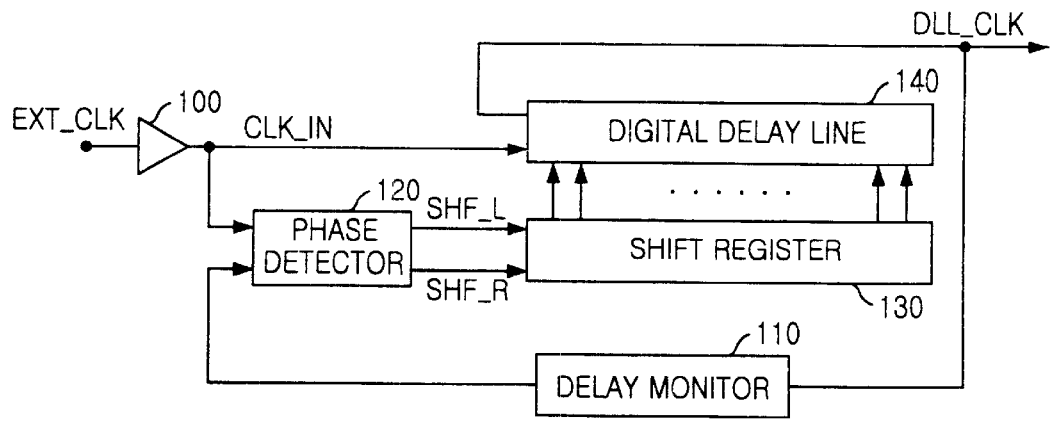
FIG. 1 is a block diagram of a conventional delay locked loop (DLL)
Figure 2:
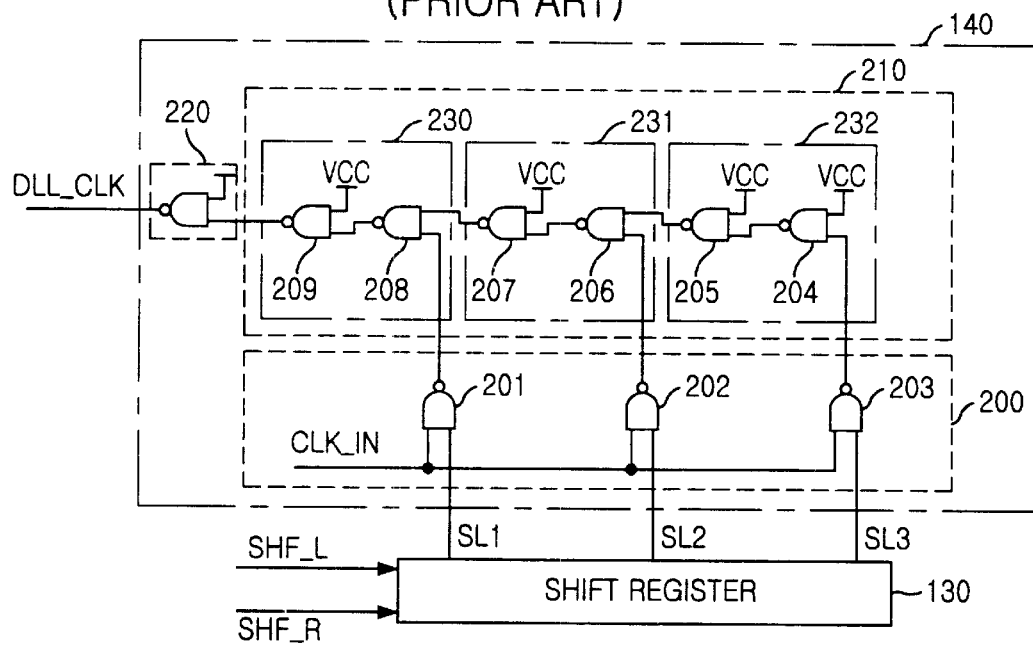
FIG. 2 is a circuit diagram of a digital delay line having three delay units.

The second shift register 350 controls the delay amount of an output of the first delay line 340 in response to one of a second shift-left signal SHF_L2 and a second shift-right signal SHF_R2, which are outputted from the first shift register 330. For example, assuming the initial state of the output of the second shift register 350 to the second delay line 360 is a logic combination of 010, if the first shift register 330 generates a second shift-right signal SHF_R2 then the output of the second shift register 350 becomes a logic combination of 001 from a logic combination of 010. However, if the first shift register 330 generates a second shift-left signal SHF_L2 then the output of the second shift register 350 becomes a logic combination of 100 from a logic combination of 010. In other words, shift register 350 operates like the conventional shift register 130 described above in connection with FIGS. 1 and 2.

The second delay line 360 delays an output of the first delay line 340 by a predetermined delay amount in response to an output of the second shift register 350. Preferably, the second delay line 360 is structured and operates like the delay line 140 described above in connection with FIGS. 1 and 2. The second delay line 360 includes a plurality of delay units having a delay amount larger than that of the plurality of delay units in the first delay line 340. As a result, the first delay line 340 provides greater precision in controlling a delay to the internal clock CLK_IN because a delay amount of the first delay line 340 is a smaller increment of a delay amount of the second delay line 360.

Figure 4:
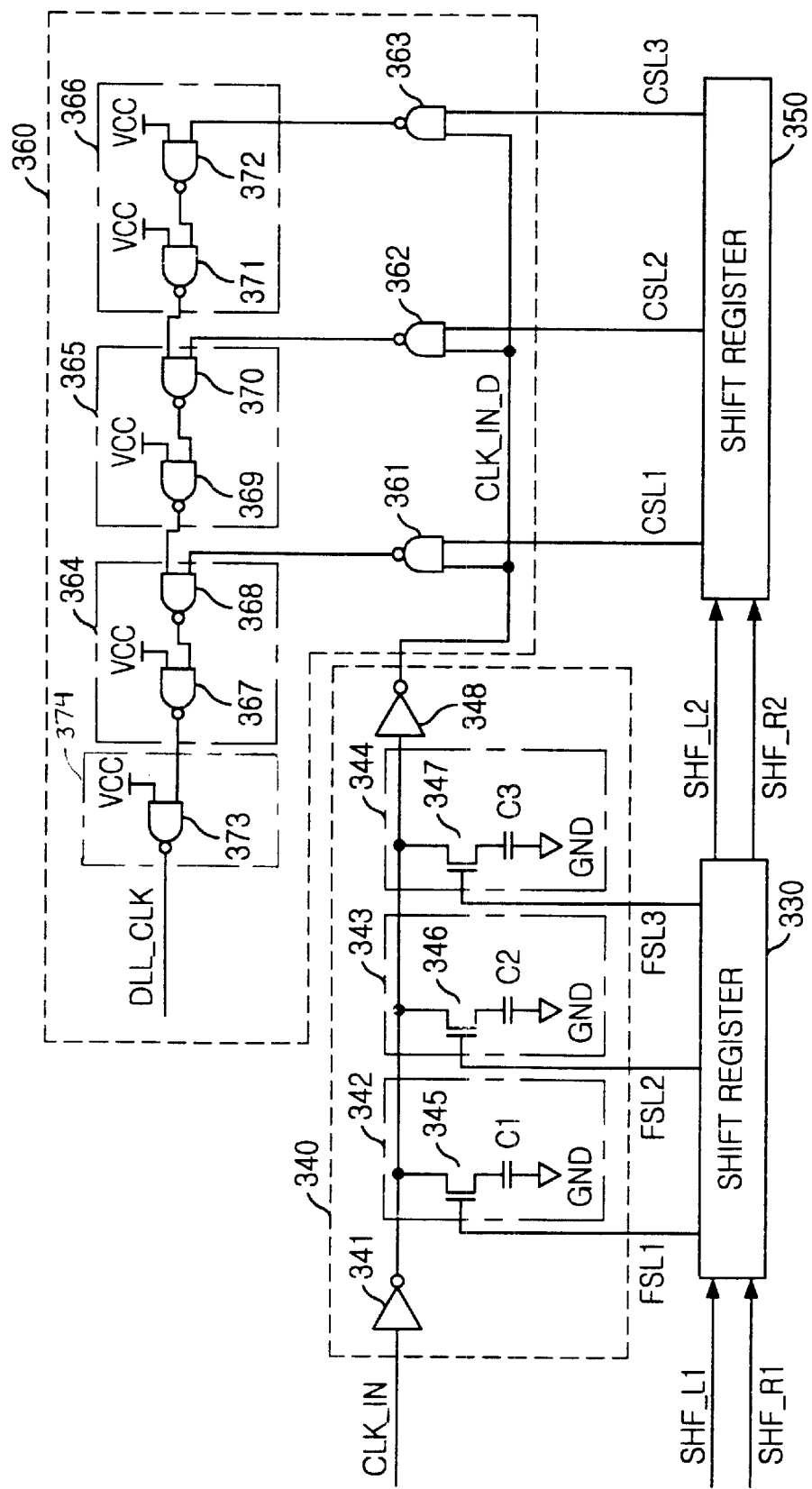
FIG. 4 is a circuit diagram illustrating a first delay line and a second delay line as shown in FIG. 3.

FIG. 4 is a more detailed circuit diagram illustrating the first delay line 340 and the second delay line 360. Referring to FIG. 4, the first delay line 340 controls the delay amount of the internal clock CLK_IN in response to a first, a second, and a third shift control signals FSL1, FSL2 and FSL3, respectively. The second delay line 360 controls a delay amount of an output of the first delay line 340 in response to a fourth, a fifth, and a sixth shift control signals CSL1, CSL2, CSL3, respectively.

The first delay line 340 includes a first inverter 341 for inverting the internal clock CLK_IN. The first delay line 340 also includes a plurality of first delay units, generally shown as 342, 343, and 344, for controlling the delay amount of the internal clock CLK_IN. The first delay line 340 further includes a second inverter 348 for inverting an output of the first inverter 341.

Each of the first delay units 342, 343, 344 is implemented with an NMOS transistor 345, 346, and 347, respectively, and a capacitor C1, C2, and C3, respectively. The NMOS transistors 345, 346, 347 and the capacitors C1, C2, C3 are serially coupled to each other, respectively, between an output terminal of the first inverter 341 and a ground terminal GND as shown in FIG. 4. For example, the NMOS transistor 345 is serially coupled to the capacitor C1 in the first delay unit 342. Additionally, each gate of NMOS transistors 345, 346, 347 receives the first, the second, and the third shift control signals FSL1, FSL2, FSL3, respectively.

Each of the NMOS transistors 345, 346, 347 performs a switching operation in response to a respective one of the first, the second, and the third shift control signals FSL1, FSL2, FSL3. The capacitance of the capacitors C1, C2, C3 is selectively transferred to the second delay line 360 so that the internal clock CLK_IN is delayed by a relatively small delay amount. For example, if the first shift control signal FSL1 is a logic high and the second and third shift control signals FSL2, FSL3 are a logic low, only the NMOS transistor 345 is turned on. As a result, the delay amount of the internal clock CLK_IN is increased by the capacitance of the capacitor C1. Similarly, if the first and second shift control signals FSL1 and FSL2 are a logic high and the third shift control signal FSL3 is a logic low, the NMOS transistors 345, 346 are turned on. Accordingly, the delay amount of the internal clock CLK_IN is increased by the capacitance of capacitors C1 and C2.

The second delay line 360 generally includes a plurality of NAND gates 361, 362, 363, a plurality of second delay units 364, 365, 366, and an output unit 374. The NAND gates 361, 362, 363 are coupled to the second delay units 364, 365, 366, respectively. The output unit 374 includes a NAND gate 373, which is coupled to an output of one of the second delay units 364.

The NAND gates 361, 362, 363 receive and perform a logic NAND function with an output CLK_IN_D of the first delay line 340 and the fourth, the fifth, and the sixth shift control signals CSL1, CSL2, CSL3, respectively. Each output of the NAND gates 361, 362, 363 is inputted to the second delay units 364, 365, 366, respectively. For example, the output of the NAND gate 361 is inputted to the second delay unit 364.

Each of the second delay units 364, 365, 366 includes a first NAND gate 368, 370, 372, respectively, and a second NAND gate 367, 369, 371, respectively. In each of the second delay units 364, 365, 366, the first NAND gates 368, 370, 372 perform a logic NAND function. In the second delay unit 364, for example, the first NAND gate 368 performs a logic NAND function with an output of a corresponding NAND gate 361 and an output of a previous second delay unit 365. Similarly, the first NAND gate 370 in the second delay unit 365 performs a logic NAND function with an output of a corresponding NAND gate 362 and an output of a previous second delay unit 366. In the second delay unit 366, however, the first NAND gate 372 performs a logic NAND function but with an output of a corresponding NAND gate 363 and a power potential VCC.

In each of the second delay units 364, 365, 366, the second NAND gates 367, 369, 371 also perform a logic NAND function with an output of a corresponding first NAND gate 368, 370, 372, respectively, and the power potential VCC. In the second delay unit 365, for example, the second NAND gate 369 performs a logic NAND function with an output of the corresponding first NAND gate 370 and the power potential VCC.

The output unit 374 includes a NAND gate 373 that generates the DLL clock DLL_CLK by performing a logic NAND function of the power potential VCC and an output of one of the second delay units 364. In other words, the output unit 374 acts as an inverter.

Figure 5A:
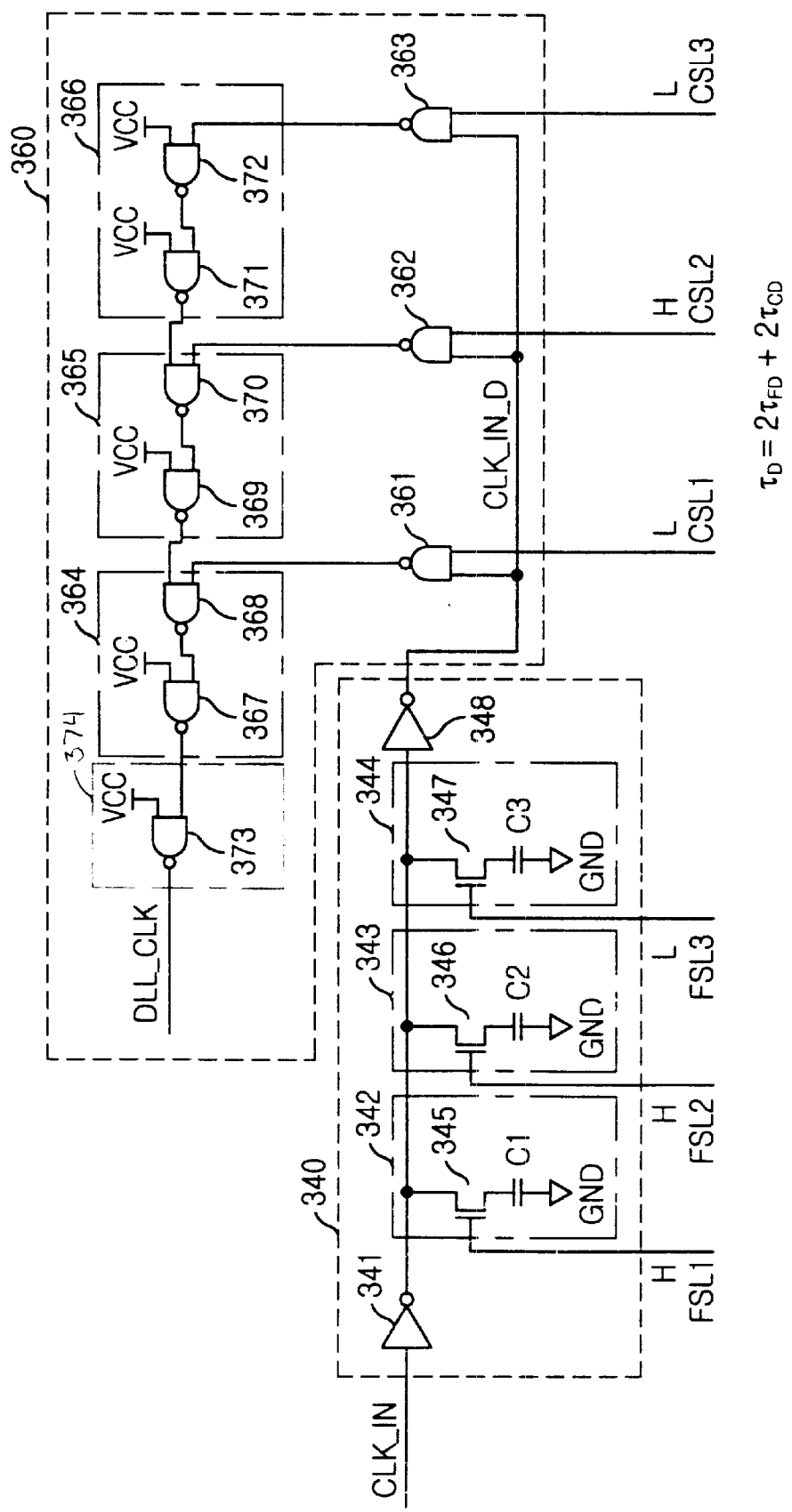
FIGS. 5A, 5B, and 5C are circuit diagrams illustrating a shift-right operation of the DLL.
Figure 5B:
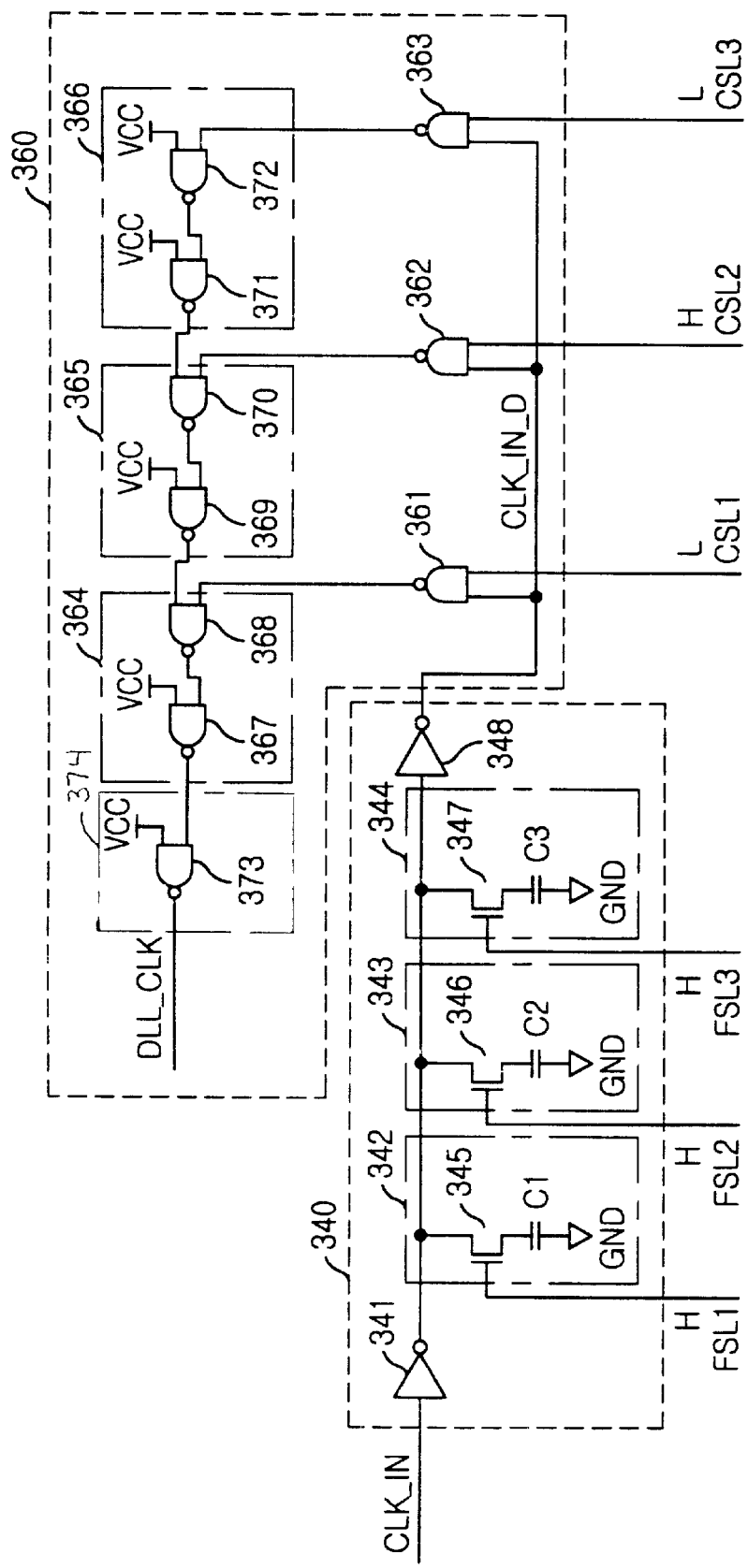
Figure 5C:
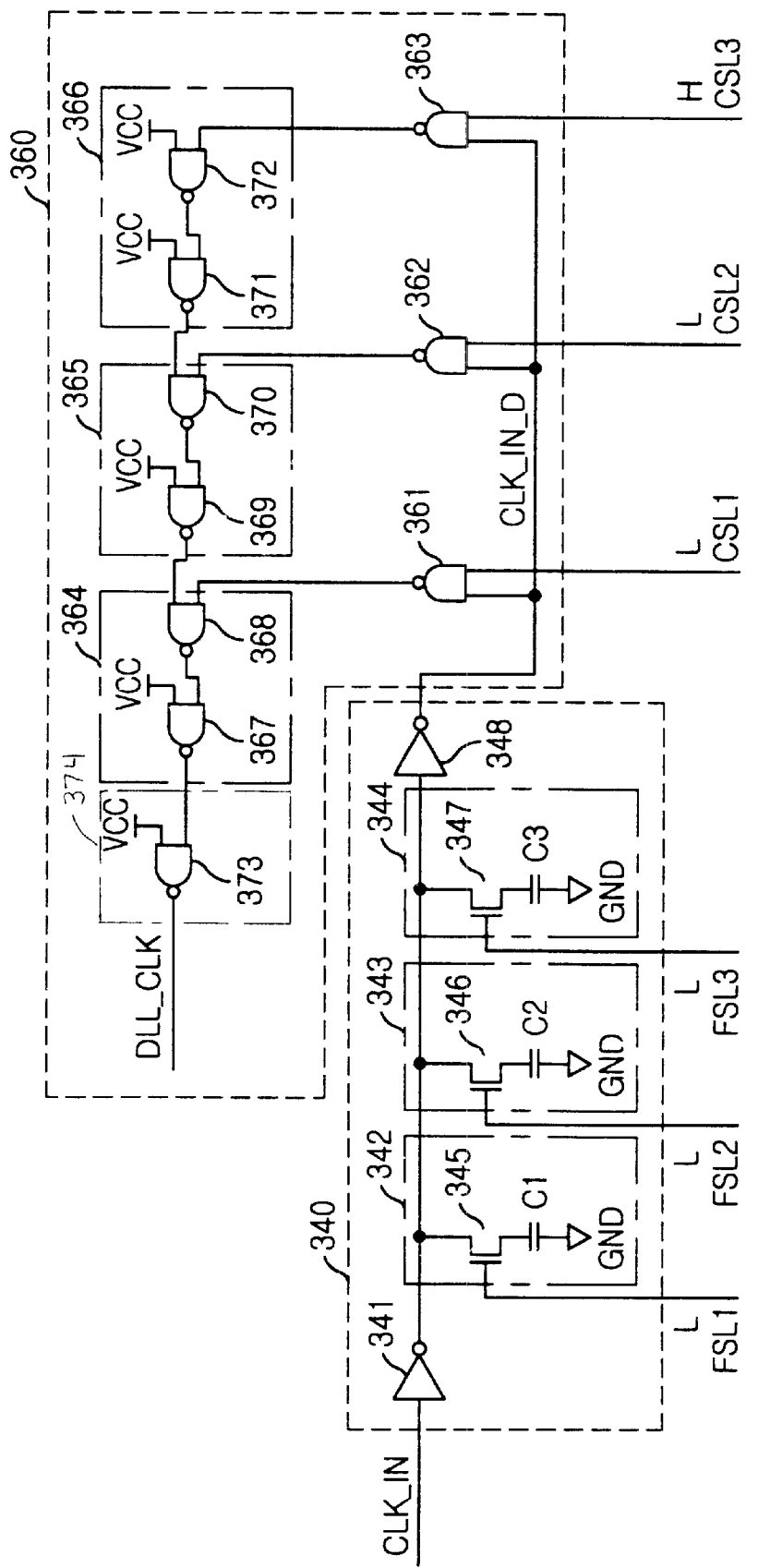
Figure 7:
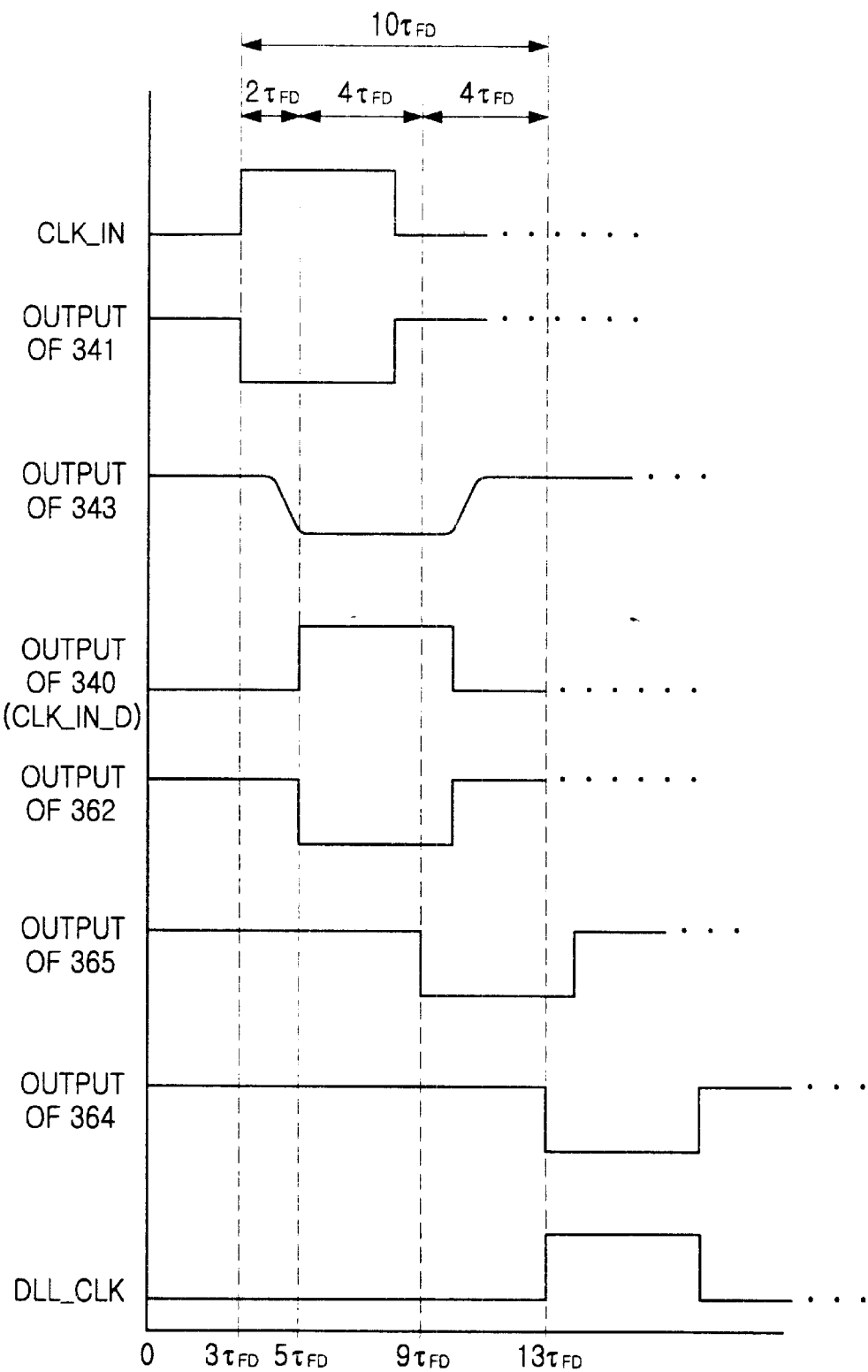
FIG. 7 is a timing diagram illustrating a right-shift operation of the DLL as shown in FIG. 5A.

FIGS. 5A to 5C are circuit diagrams illustrating a shift-right operation of the disclosed DLL. FIGS. 5D to 5F are truth tables to the circuit diagrams illustrated in FIGS. 5A to 5C, respectively. A timing diagram in conjunction with FIG. 5A is shown in FIG. 7, which is further discussed below. $\tau_{FD}$ (fine delay) denotes the delay amount of each of the first delay units 342, 343, 344, and $\tau_{CD}$ (coarse delay) denotes the delay amount of each of the second delay units 345, 346, 347. $\tau_{FD}$ has a value smaller than $\tau_{CD}$. For example, $\tau_{CD}$ is preferably equal to $4\tau_{FD}$.

Referring to FIGS. 5A and 5D, the first, the second, and the third shift control signals FSL1, FSL2, FSL3 are a logic high, a logic high, and a logic low, respectively, i.e., the output of the first shift register 330 to the first delay line 340 is a logic combination of 110. Because the first and the second shift control signals are logic highs, the NMOS transistors 345, 346 in the first delay units 342, 343, respectively, are turned on. Accordingly, the capacitance of the capacitors C1, C2 in the first delay units 342, 343 increase the delay amount of the output of the first inverter 341 as one of ordinary skill in the art will readily recognize.

The second delay line 360 receives the output of the first delay line CLK_IN_D and the fourth, the fifth, and the sixth shift control signals CSL1, CSL2, CSL3. In this example, the fourth, the fifth, and the sixth shift control signals CSL1, CSL2, CSL3 are a logic low, a logic high, and a logic low, respectively (i.e., the second shift register 350 outputs a logic combination of 010). As noted above, each of the NAND gates 361, 362, 363 of the second delay line 360 receives the output of the first delay line CLK_IN_D and one of the fourth, the fifth, and the sixth shift control signals CSL1, CSL2, CSL3. For example, the NAND gate 361 receives the output of the first delay line CLK_IN_D and the fourth shift control signal CSL1, which is a logic low. As a result, the output of the NAND gate 361 is a logic high. Accordingly, the output of the first delay line CLK_IN_D does not matter (i.e., a "don't care") to the NAND gate 361 because the fourth shift control signal CSL1 is a logic low. Similarly, the output of the first delay line CLK_IN_D is also a "don't care" to the NAND gate 363 because the sixth shift control signal CSL3 is a logic low.

In contrast, the output of the NAND gate 362 depends on the output of the first delay line CLK_IN_D because the fifth shift control signal CSL2 is a logic high. In particular, when the output of the first delay line CLK_IN_D is a logic high then the output of the NAND gate 362 is a logic low. When the output of the first delay line CLK_IN_D is a logic low then the output of the NAND gate 362 is a logic high. The NAND gate 362, therefore, provides an output that is the output of the first delay line CLK_IN_D inverted.

As noted above, the output of the NAND gate 363 is a logic high and as a result, the output of the second delay unit 366, i.e., the output of the NAND gate 371, is also a logic high. Accordingly, the output of the second delay unit 365 is the same as the output of the NAND gate 362, but delayed in time by delay unit 365. Furthermore, the output of the NAND gate 361 is a logic high so the output of the second delay unit 364 is the output of the second delay unit 365 delayed through the second delay unit 364. The output unit 374 inverts the output of the second delay unit 364 to provide the DLL clock DLL_CLK. Accordingly, DLL clock DLL_CLK is the output of the first delay line CLK_IN_D delayed through two second delay units 364, 365. Therefore, the output of the output unit 374 is the DLL clock DLL_CLK, which is the internal clock CLK_IN delayed through two first delay units 342, 343 in the first delay line 340, (i.e., $2\tau_{FD}$) and two second delay units 364, 365 in the second delay line 360 (i.e., $2\tau_{CD}$). As a result, a total delay amount is equal to $(2\tau_{FD}+2\tau_{CD})$, i.e., $10\tau_{FD}$.

Referring to FIGS. 5B and 5E, when the phase detector 320 generates the first shift-right signal SHF_R1, all of the first, the second, and the third shift control signals FSL1, FSL2, FSL3 become logic highs, i.e., the output of the first shift register 330 to the first delay line 340 is a logic combination of 111. In particular, the output of the first shift register 330 becomes a logic combination of 111 from a logic combination of 110 as shown in FIGS. 5A and 5D if the phase detector 320 generates the first shift-right signal SHF_R1. Because the first, the second, and the third shift control signals FSL1, FSL2, FSL3 are logic highs, the NMOS transistors 345, 346, 347 in the delay units 342, 343, 344, respectively, are turned on. The capacitance of the capacitors C1, C2, C3 in the delay units 342, 343, 344, respectively, increase the delay amount of the output of the first inverter 341 by a delay amount of $3\tau_{FD}$. Accordingly, the output of the first delay line CLK_IN_D is the internal clock CLK_IN delayed by $3\tau_{FD}$.

The fourth, the fifth, and the sixth shift control signals CSL1, CSL2, CSL3 remain the same, i.e., a logic low, a logic high, and a logic low, respectively, as in FIG. 5A. Accordingly, the output of the output unit 374 is the DLL clock DLL_CLK, which is the internal clock CLK_IN delayed through three first delay units 341, 342, 343 in the first delay line 340 (i.e., $3\tau_{FD}$) and two second delay units 364, 365 in the second delay line 360 (i.e., $2\tau_{CD}$). Therefore, a total delay amount is equal to $[(2\tau_{FD}+2\tau_{CD})+\tau_{FD}]$, i.e., $11\tau_{FD}$.

Referring to FIGS. 5C and 5F, when the phase detector 320 again generates the first shift-right signal SHF_R1, there is no additional delay unit for further increasing the delay amount in the first delay line 340. However, because $4\tau_{FD}=\tau_{CD}$, and delay increase corresponding to one more $\tau_{FD}$ can be achieved by activating one more delay unit in the second delay line 360 (i.e., adding $1\tau_{CD}$) and turning off all three of the delay units 342, 343, 344 in the first delay line 340 (i.e., subtracting $3\tau_{FD}$), the output of the first shift register 330 is switched to a logic combination of 000 (i.e., FSL1, FSL2 and FSL3 are logic low). This change in logic state (from 111 to 000) causes the first shift register 330 to generate a second shift-right signal SHF_R2.

As described above, the second shift register 350 responds to the shift-right signal SHF_R2 by shifting the logic high signal to the right one step (e.g., from CSL2 to CSL3). Conversely, if the first shift register 330 is in its lowest state (i.e., FSL1, FSL2, FSL3 are all zero) and a shift-left signal SHF_L1 is received, the shift register 330 changes from logic combination 000 to logic combination 111 (i.e., add $3\tau_{FD}$), and generates a shift-left signal SHF_L2. The second shift register 350 responds to the shift-left signal SHF_L2 by moving the logic high signal left one step (e.g., from CSL2 to CSL1) to thereby subtract $1\tau_{CD}$ so that a total of $1\tau_{FD}$ of delay is reduced ($3\tau_{FD}-1\tau_{CD}=-1\tau_{FD}$)

Returning to the example where a second shift-right signal SHF_R2 has been generated, the second shift register 350 performs a shift-right operation. Accordingly, the fourth, the fifth, and the sixth shift control signals CSL1, CSL2, CSL3 are a logic low, a logic low, and a logic high, respectively, i.e., shifted from a logic combination of 010 to a logic combination of 001. Because the sixth shift control signal CSL3 is a logic high, the output of the NAND gate 363 is the output of the first delay line CLK_IN_D inverted. As a result, the output of the second delay unit 366 is the output of the NAND gate 363 delayed through the second delay unit 366. The fifth control signal CSL2 is a logic low so the output of the first delay line CLK_IN_D does not matter to the NAND gate 362, i.e., a "don't care." Accordingly, the output of the NAND gate 362 is a logic high regardless of the state of CLK_IN_D. As a result, the output of the second delay unit 365 is the output of the NAND gate 363 delayed through two second delay units 365, 366. The fourth control signal CSL1 is a logic low so the output of the first delay line CLK_IN_D does not matter to the NAND gate 361, i.e., a "don't care." Therefore, the output of the NAND gate 361 is a logic high. The output of the delay unit 364 is the output of the NAND gate 363 delayed through three second delay units 364, 365, 366. The output unit 374 performs a logic NAND function with the power potential VCC and the output of the delay unit 364 to provide the DLL clock DLL_CLK. The DLL_CLK is the output of the first delay line CLK_IN_D delayed through three second delay units 364, 365, 366. Accordingly, the output of the output unit 374 is the DLL clock DLL_CLK, which is the internal clock CLK_IN delayed through three second delay units 364, 365, 366 only in the second delay line 360, i.e., $3\tau_{CD}$. As a result, the internal clock CLK_IN is delayed by as much as $3\tau_{CD}=12\tau_{FD}$. An increase of up to 3 more $\tau_{FD}$ can be achieved for a total of $15\tau_{FD}$ by turning FSL1, FSL2 and FSL3 to logic highs so that all possible delay units are activated.

Figure 6A:
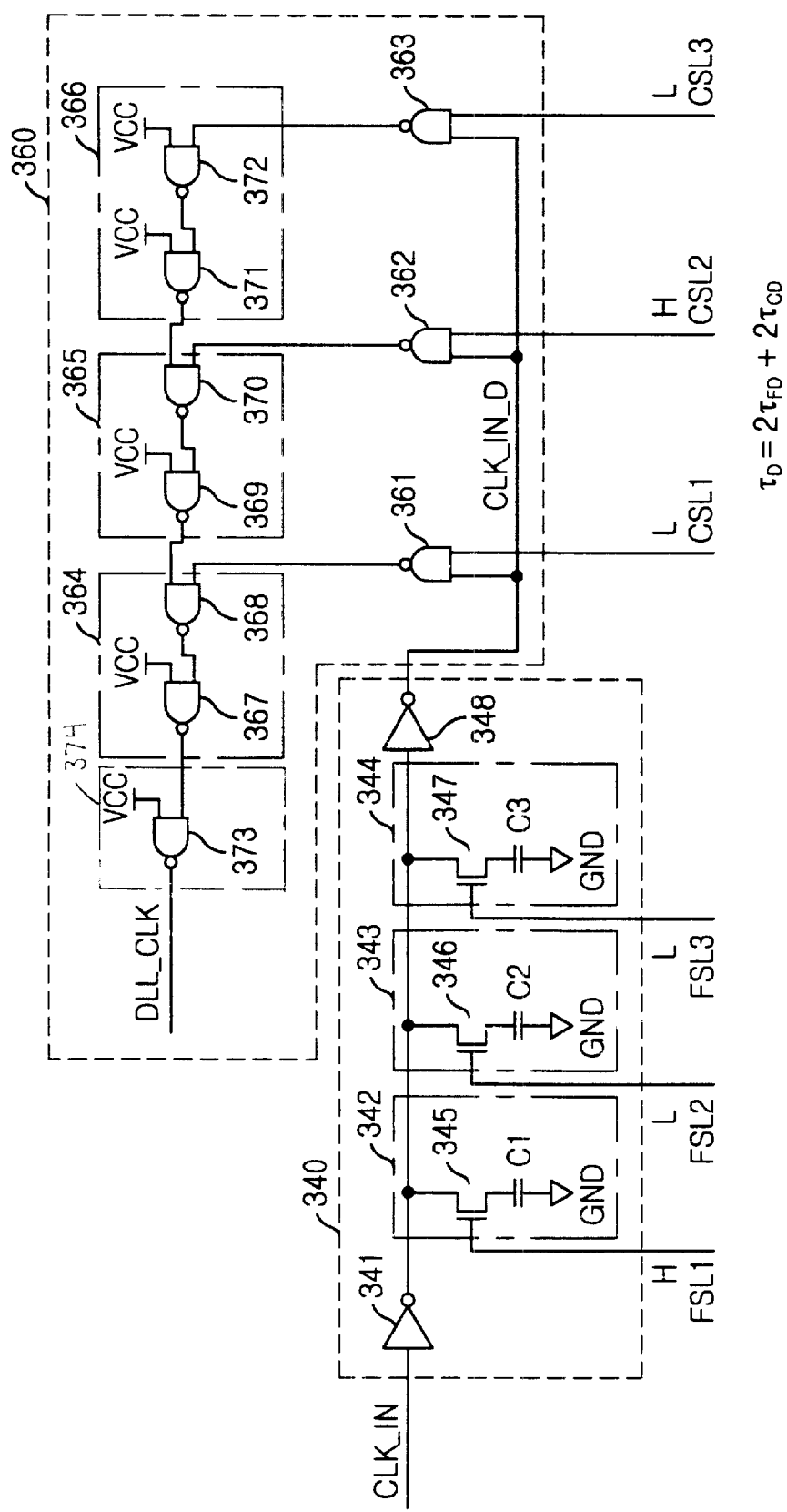
FIGS. 6A, 6B, and 6C are circuit diagrams illustrating a shift-left operation of the DLL.
Figure 6B:
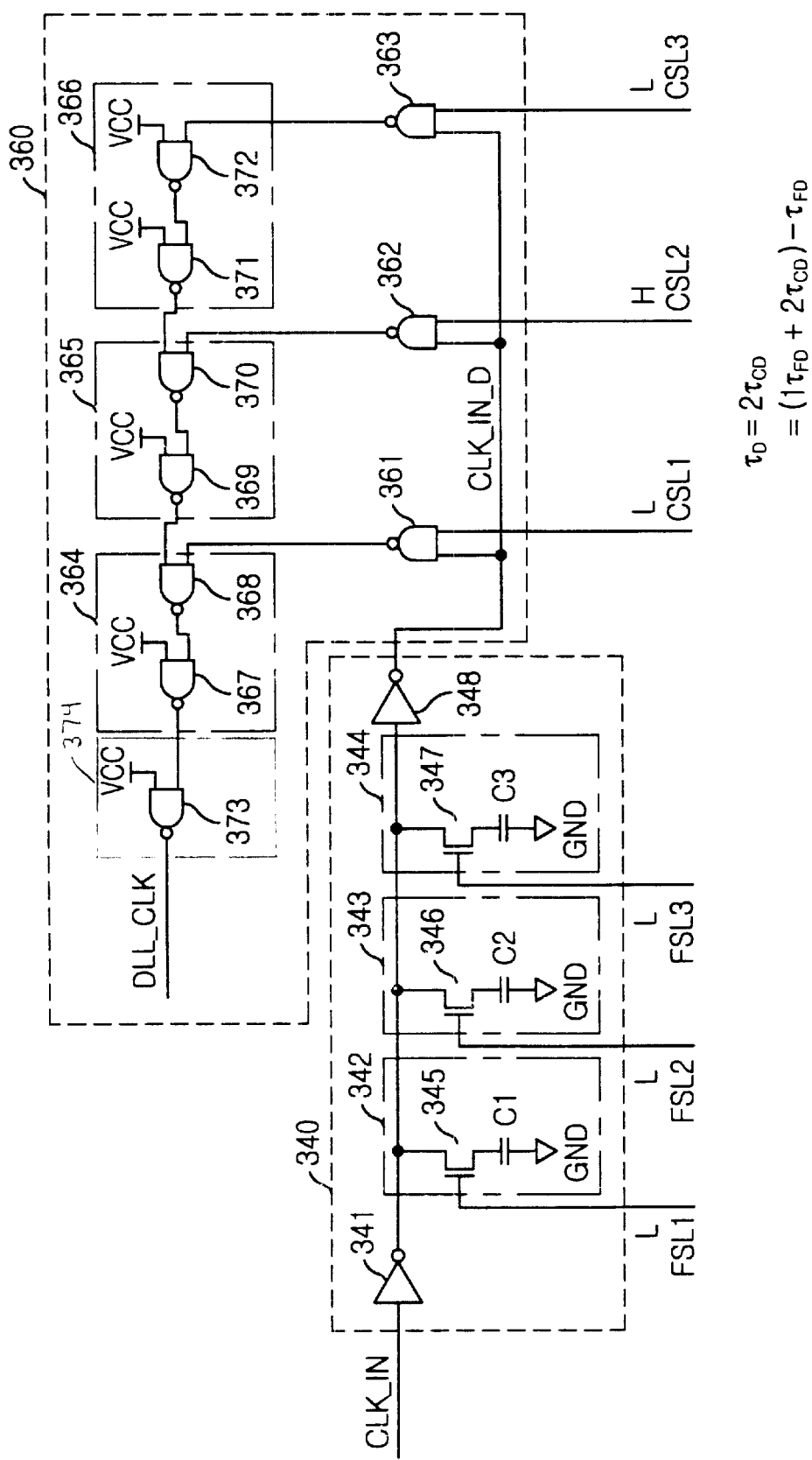
Figure 6C:
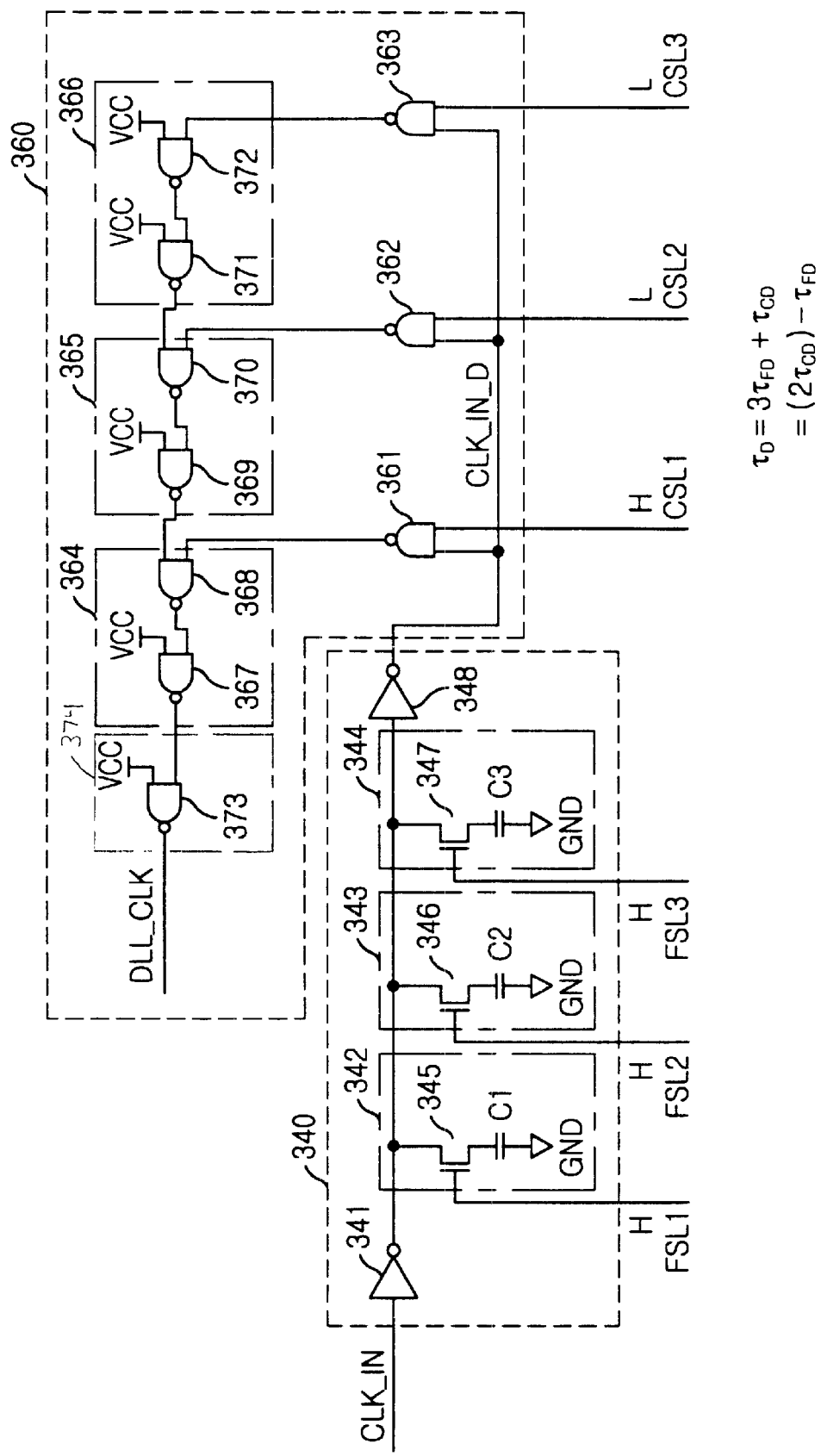

FIGS. 6A to 6C are circuit diagrams illustrating a shift-left operation of the disclosed DLL. FIGS. 6D to 6F are truth tables corresponding to the circuit diagrams illustrated in FIGS. 6A to 6C, respectively. Referring to FIGS. 6A and 6D, when only the first and the fifth shift control signals FSL1 and CSL2 are a logic high (i.e., the output of the first shift register 330 to the first delay line 340 is a logic combination of 100, and the output of the second shift register 350 to the second delay line 360 is a logic combination of 010), the internal clock CLK_IN is delayed through one first delay unit 342 in the first delay line 340 and two first delay units 364, 365 in the second delay line 360. In particular, the NMOS transistor 345 is turned on, and the output of the first inverter 341 is delayed by one first delay unit 342 in the first delay line 340. As noted above, the output of the first inverter 341 is the internal clock CLK_IN inverted. Accordingly, the output of the first delay line CLK_IN_D is the internal clock CLK_IN delayed by one first delay unit 342.

The second delay line 360 receives the output of the first delay line CLK_IN_D and the fourth, the fifth, and the sixth shift control signals CSL1, CSL2, CSL3, respectively. Similar to FIGS. 5A and 5B, the fourth, the fifth, and the sixth shift control signals CSL1, CSL2, CSL3 in FIG. 6A are a logic low, a logic high, and a logic low, respectively (i.e., the second shift register 350 outputs a logic combination of 010). Accordingly, the output of the NAND gate 362 is delayed by two second delay units 364, 365 in the second delay line 360. The output unit 374 inverts the output of the second delay unit 364 to provide the delay locked loop clock DLL_CLK. The delay locked loop clock DLL_CLK is the internal clock CLK_IN delayed through one first delay unit 342 in the first delay line 340 (i.e., $\tau_{FD}$) and two second delay units 364, 365 in the second delay line 360 (i.e., $2\tau_{CD}$). As a result, a total delay amount is equal to ($\tau_{FD}+2\tau_{CD}$) i.e., $9\tau_{FD}$.

Referring to FIGS. 6B and 6E, when the phase detector 320 generates the first shift-left signal SHF_L1, all of the first, the second, and the third shift control signals FSL1, FSL2, FSL3 become logic lows, i.e., the output of the first shift register 330 to the first delay line 340 is a logic combination of 000. None of the NMOS transistors 345, 346, 347 in the first delay units 342, 343, 344 are turned on. Accordingly, the output of the first inverter 341 is not delayed through a first delay unit in the first delay line 340. Therefore, the output of the first delay line CLK_IN_D is the internal clock CLK_IN without any first delay unit.

Similar to FIG. 6A, the fourth, the fifth, and the sixth shift control signals CSL1, CSL2, CSL3 in FIG. 6B are a logic low, a logic high, and a logic low, respectively (i.e., a logic combination of 010). The output of the NAND gate 363 is a logic high so the output of the second delay unit 366 is also a logic high. The output of the NAND gate 362 is the output of the first delay line CLK_IN_D inverted. The output of the second delay unit 365 is the output of the NAND gate 362 delayed through the second delay unit 365. The output of the NAND gate 361 is a logic high so the output of the second delay unit 364 is the output of the NAND gate 362 delayed through two second delay units 364, 365. The output unit 374 inverts the output of the delay unit 364 to provide the delay locked loop clock DLL_CLK. The DLL_CLK is the output of the first delay line CLK_IN_D delayed through two second delay units 364, 365. As noted above, the output of first delay line CLK_IN_D in FIG. 6B is the internal clock CLK_IN without any first delay unit. Accordingly, the delay locked loop DLL_CLK is the internal clock CLK_IN delayed through two second delay units 364, 365 in the second delay line 360, i.e., a second delay amount of $2\tau_{CD}$. Therefore, a total delay amount is equal to $2\tau_{CD}$, i.e., [($\tau_{FD}+2\tau_{CD}$)$-\tau_{FD}$] or $8\tau_{FD}$.

Referring to FIGS. 6C and 6F, when the phase detector 320 again generates the first shift-left signal SHF_L1, there is no further delay unit for further decreasing the delay amount in the first delay line 340 (i.e., there is already no delay produced by the first delay line 340). Accordingly, the first, the second, and the third shift control signals FSL1, FSL2, FSL3 become logic highs, i.e., the output of the first shift register 330 to the first delay line 340 becomes a logic combination 111 from a logic combination of 000 as shown in FIGS. 6B and 6E. All of the NMOS transistors 345, 346, 347 are turned on, and the output of the first inverter 341 is delayed through three first delay units 342, 343, 344 (i.e., $3\tau_{FD}$). Therefore, the output of the first delay line CLK_IN_D is the internal clock CLK_IN delayed through three first delay units 342, 343, 344.

As a result, the first shift register 330 generates a shift-left signal SHF_L2. The second shift register 350 responds by shifting the logic high signal one step left, i.e., the fourth, the fifth, and the sixth shift control signals CSL1, CSL2, CSL3 are a logic high, a logic low, and a logic low, respectively. This has the effect of activating only delay unit 364 (i.e., delay units 365 and 366 are switched off) as explained above. The delay locked loop DLL_CLK is the first delay line CLK_IN_D delayed through the second delay unit 364. Therefore, the delay locked loop DLL_CLK is the internal clock CLK_IN delayed through three first delay units 342, 343, 344 in the first delay line 340 (i.e., a first delay amount of $3\tau_{FD}$) and one second delay unit 364 in the second delay line 360 (i.e., a second delay amount of $\tau_{CD}$). As a result, the internal clock CLK_IN is delayed by $(3\tau_{FD}+\tau_{CD})$, i.e., $(2\tau_{CD}-\tau_{FD})$ or $7\tau_{FD}$.

FIG. 7 is a timing diagram of a right-shift operation of the DLL as shown in the circuit diagram of FIG. 5A. As noted above, $\tau_{FD}$ denotes a delay amount of each of the first delay units 342, 343, 344, and $\tau_{CD}$ denotes a delay amount of each of the second delay units 345, 346, 347. In particular, $\tau_{CD}$ is equal to $4\tau_{FD}$.

Referring to FIG. 7, the internal clock CLK_IN is inverted by the first inverter 341 of the first delay line 340. In this example, the first and the second shift control signals FSL1, FSL2 are logic highs. Accordingly, the NMOS transistors 345, 346 in the first delay units 342, 343, respectively, are turned on. The output of the first inverter 341 is delayed through two first delay units 342, 343 in the first delay line 340, i.e., $2\tau_{FD}$. For example, the internal clock CLK_IN goes high at $3\tau_{FD}$. The internal clock CLK_IN is inverted by the first inverter 341, delayed through two first delay units 342, 343, i.e., $2\tau_{FD}$, and inverted by the second inverter 348 to generate the output of the first delay line CLK_IN_D.

Because, in this example, the fourth and the sixth shift control signals CSL1, CSL3 are logic lows and the fifth shift control signal CSL2 is logic high, only the first and second delay units 364, 365 in the second delay line 360 are activated. Accordingly, the output of the second delay unit 365 is the output of the NAND gate 362 delayed through the second delay unit 365. As noted above, the delay amount of the second delay unit 365 is $\tau_{CD}$, which is equal to $4\tau_{FD}$. Therefore, the output of the second delay unit 365 is the output of the NAND gate 362 delayed through $4\tau_{FD}$. The output of the second delay unit 364 is based on the output of the NAND gate 361 and the output of the second delay unit 365. The second delay unit 364 also has a delay amount of $\tau_{CD}$, i.e., $4\tau_{FD}$. As a result, the output of the second delay unit 364 is the output of the second delay unit 365 delayed through $4\tau_{FD}$, i.e., the output of the NAND gate 362 delayed through $8\tau_{FD}$. The output unit 374 inverts the output of the second delay unit 364 to provide the delay locked loop DLL_CLK. The delay locked loop DLL_CLK is the output of the first delay line CLK_IN_D delayed through two second delay units 364, 365 in the second delay line 360, i.e., $8\tau_{FD}$. Accordingly, the delay locked loop DLL_CLK is the internal clock CLK_IN delayed through two first delay units 342, 343 in the first delay line 340, i.e., $2\tau_{FD}$, and two second delay units 364, 365 in the second delay line 360, i.e., $8\tau_{FD}$. As a result, the internal clock CLK_IN has a total delay amount of $10\tau_{FD}$.

As can be seen, a request to increase or decrease the delay amount is always responded to by a fine delay step $\tau_{FD}$ in the appropriate direction. As a result, the total delay amount of the internal clock CLK_IN may be controlled with greater precision than in prior art devices (i.e., $\tau_{FD}$ is a smaller than $\tau_{CD}$). Additionally, since a minimum delay unit $\tau_{FD}$ depends on the capacitance of the capacitors contained in the first delay units, it is possible to obtain a desired delay unit even at a low power voltage by properly designing the capacitors and the number of the first delay units contained in the first delay line 340.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A delay locked loop (DLL) comprising:
   a first shift register responsive to a first shift-right signal and a first shift-left signal;
   a first delay line for delaying an internal clock in response to an output of the first shift register, wherein the first delay line includes a plurality of first delay units;
   a second shift register responsive to at least one of a second shift-right signal and a second shift-left signal outputted from the first shift register; and
   a second delay line for delaying an output of the first delay line in response to an output of the second shift register, wherein the second delay line includes a plurality of second delay units.

2. The delay locked loop as recited in claim 1 further comprising:
   a clock buffer for receiving an external clock to generate the internal clock;
   a delay monitor for receiving an output of the second delay line to add a predetermined amount of delay to an output of the delay locked loop; and
   a phase detector for comparing a phase difference between the internal clock and the output of the delay monitor, the phase detector generating one of the first shift-left signal and the first shift-right signal.

3. The delay locked loop as recited in claim 1, wherein the first delay line includes:
   a first inverter for inverting the internal clock; and
   a second inverter for inverting an output of the first inverter.

4. The delay locked loop as recited in claim 3, wherein each of the plurality of first delay units includes:
   a transistor having a gate for receiving a control signal outputted from the first shift register; and
   a capacitor in communication with the transistor.

5. The delay locked loop as recited in claim 3, wherein the second delay line includes a plurality of first NAND gates, each first NAND gate receiving an output of the first delay line and an output of the second shift register, and wherein each of the second delay units includes: (1) a second NAND gate receiving an output of a respective one of the first NAND gates and (2) a third NAND gate receiving an output of the second NAND gate, the second delay units being connected in series.

6. The delay locked loop as recited in claim 1, wherein each of the first delay units is adapted to delay the internal clock by a first delay amount, each of the second delay units is adapted to delay the internal clock by a second delay amount, and the second delay amount is greater than the first delay amount.

7. The delay locked loop as recited in claim 6, wherein the second delay amount is an integer multiple of the first delay amount.

8. The delay locked loop as recited in claim 7, wherein a total delay produced by activating all of the first delay units in the plurality of first delay units is less than the second delay amount.

9. The delay locked loop as recited in claim 1, wherein the second shift-right signal is produced when all of the first delay units are activated and a first shift-right signal is received at the first shift register.

10. The delay locked loop as recited in claim 9, wherein the first delay units are all deactivated when a first shift-right signal is received at the first shift register when all of the first delay units are activated.

11. The delay locked loop as recited in claim 9, wherein the second shift-left signal is produced when none of the first delay units are activated and a first shift-left signal is received at the first shift register.

12. The delay locked loop as recited in claim 11, wherein the first delay units are all activated when a first shift-left signal is received at the first shift register when none of the first delay units are activated.

13. The delay locked loop as recited in claim 6, wherein a first shift-right signal results in a delay increase of the first delay amount.

14. The delay locked loop as recited in claim 7, wherein a first shift-left signal results in a delay decrease of the first delay amount.

15. The delay locked loop as recited in claim 1, wherein a second delay unit is activated if all of the first delay units are activated and more delay is needed.

16. For use in a semiconductor memory, a delay locked loop comprising:
   a first delay line for selectively delaying a received signal to develop a delayed signal, the first delay line having a plurality of delay units, at least one of the delay units comprising a capacitor and a controlled switch, the controlled switch being switchable between a first state wherein the capacitor is connected to delay the received signal and a second state wherein the capacitor is disconnected; and
   a second delay line in communication with the first delay line for selectively delaying the delayed signal.

17. The delay locked loop as recited in claim 16, wherein the delayed signal is not delayed relative to the received signal.

18. The delay locked loop as recited in claim 16, wherein the received signal comprises an internal clock signal.

19. The delay locked loop as recited in claim 16, wherein the first delay line comprises:
   a first inverter for inverting the received signal; and
   a second inverter for inverting an output of the first inverter.

20. The delay locked loop as recited in claim 16, wherein the controlled switch comprises a transistor.

21. The delay locked loop as recited in claim 16, wherein the second delay line comprises:
   a plurality of second delay line NAND gates; and
   a plurality of second delay units connected in series.

22. The delay locked loop as recited in claim 21, wherein each of the second delay units comprises:
   a first NAND gate receiving an output of a corresponding one of the second delay line NAND gates; and
   a second NAND gate for receiving an output of the first NAND gate.

23. The delay locked loop as recited in claim 21, wherein each of the second delay units comprises:
   a first NAND gate receiving an output of a corresponding one of the second delay line NAND gates; and
   an inverter for inverting an output of the first NAND gate.

24. The delay locked loop as recited in claim 16 further comprising:
   a first shift register in communication with the first delay line; and
   a second shift register in communication with the second delay line,
   wherein the first shift register triggers a first shift-right signal in response to a first predetermined condition and triggers a first shift-left signal in response to a second predetermined condition, and wherein the second shift register is responsive to at least one of the shift-right signal and the shift-left signal.

25. The delay locked loop as recited in claim 24 further comprising:
   a phase comparator coupled to the first shift register; and
   a delay monitor coupled to the phase comparator.

26. The delay locked loop as recited in claim 16, wherein each of the delay units in the first delay line is adapted to delay the received signal by a first delay amount, the second delay line includes a plurality of second delay units, each of the second delay units is adapted to delay the delayed signal by a second delay amount, and the second delay amount is greater than the first delay amount.

27. The delay locked loop as recited in claim 26, wherein the second delay amount is an integer multiple of the first delay amount.

28. The delay locked loop as recited in claim 27, wherein a total delay produced by activating all of the delay units in the plurality of delay units in the first delay line is less than the second delay amount.

29. The delay locked loop as recited in claim 24, wherein each of the delay units in the first delay line is adapted to delay the received signal by a first delay amount, the second delay line includes a plurality of second delay units, each of the second delay units is adapted to delay the delayed signal by a second delay amount, and the second delay amount is greater than the first delay amount.

30. The delay locked loop as recited in claim 25, wherein the first shift-right signal is produced when all of the delay units in the first delay line are activated and a second shift-right signal is received at the first shift register.

31. The delay locked loop as recited in claim 30, wherein the delay units in the first delay line are all deactivated when the second shift-right signal is received at the first shift register when all of the delay units are activated.

32. The delay locked loop as recited in claim 30, wherein the first shift-left signal is produced when none of the delay units in the first delay line are activated and a second shift-left signal is received at the first shift register.

33. The delay locked loop as recited in claim 32, wherein the delay units in the first delay line are all activated when the second shift-left signal is received at the first shift register when none of the delay units in the first delay line are activated.

34. The delay locked loop as recited in claim 26, wherein a first shift-right signal results in a delay increase of the first delay amount.

35. The delay locked loop as recited in claim 34, wherein a first shift-left signal results in a delay decrease of the first delay amount.

36. The delay locked loop as recited in claim 16, wherein the second delay line includes a plurality of second delay units, and a second delay unit is activated if all of the delay units in the first delay line are activated and more delay is needed.

37. For use in a semiconductor memory, a delay locked loop comprising:
   a first delay line for selectively delaying a received signal to develop a delayed signal, the first delay line having a plurality of first delay units, each of the first delay units being adapted to selectively delay the received signal by a first delay amount; and a second delay line in communication with the first delay line for selectively delaying the delayed signal, the second delay line having a plurality of second delay units, each of the second delay units being adapted to selectively delay the received signal by a second delay amount, the second delay amount being larger than the first delay amount.

38. The delay locked loop as recited in claim 37, wherein the delayed signal is not delayed relative to the received signal.

39. The delay locked loop as recited in claim 37, wherein the received signal comprises an internal clock signal.

40. The delay locked loop as recited in claim 37, wherein the first delay line comprises:

a first inverter for inverting the received signal; and a second inverter for inverting an output of the first inverter.

41. The delay locked loop as recited in claim 37, wherein at least one of the plurality of first delay units includes:

a controlled switch; and a capacitor in communication with the controlled switch.

42. The delay locked loop as recited in claim 41, wherein the controlled switch comprises a transistor.

43. The delay locked loop as recited in claim 37, wherein the second delay line further comprises:

a plurality of second delay line NAND gates, each of the second delay line NAND gates being in communication with a corresponding one of the second delay units; and an output unit.

44. The delay locked loop as recited in claim 37, wherein each of the second delay units comprises:

a first logic element for delaying a received signal; and a second logic element for delaying an output of the first logic element.

45. The delay locked loop as recited in claim 37 further comprising:

a first shift register in communication with the first delay line; and a second shift register in communication with the second delay line, wherein the first shift register triggers a first shift-right signal in response to a first predetermined condition and triggers a first shift-left signal in response to a second predetermined condition, and wherein the second shift register is responsive to at least one of the shift-right signal and the shift-left signal.

46. The delay locked loop as recited in claim 45 further comprising:

a phase comparator coupled to the first shift register; and a delay monitor coupled to the phase comparator.

47. The delay locked loop as recited in claim 37, wherein the second delay amount is an integer multiple of the first delay amount.

48. The delay locked loop as recited in claim 47, wherein a total delay produced by activating all of the first delay units is less than the second delay amount.

49. The delay locked loop as recited in claim 45, wherein the first shift-right signal is produced when all of the first delay units are activated and a second shift-right signal is received at the first shift register.

50. The delay locked loop as recited in claim 49, wherein the first delay units are all deactivated when the second shift-right signal is received at the first shift register when all of the first delay units are activated.

51. The delay locked loop as recited in claim 45, wherein the first shift-left signal is produced when none of the first delay units are activated and a second shift-left signal is received at the first shift register.

52. The delay locked loop as recited in claim 51, wherein the first delay units are all activated when the second shift-left signal is received at the first shift register when none of the first delay units are activated.

53. The delay locked loop as recited in claim 45, wherein a first shift-right signal results in a delay increase of the first delay amount.

54. The delay locked loop as recited in claim 53, wherein a first shift-left signal results in a delay decrease of the first delay amount.

55. The delay locked loop as recited in claim 37, wherein a second delay unit is activated if all of the first delay units are activated and more delay is desired.

56. For use in a semiconductor memory, a delay locked loop comprising:

a first delay line for selectively delaying a received signal to develop a delayed signal, the first delay line having a capacitance and a plurality of first delay units, the first delay units being adapted to selectively adjust the capacitance of the first delay line; and a second delay line in communication with the first delay line for selectively delaying the delayed signal.

57. The delay locked loop as recited in claim 56, wherein the delayed signal is not delayed relative to the received signal.

58. The delay locked loop as recited in claim 56, wherein each of the first delay units comprises:

a controlled switch; and a capacitor in communication with the controlled switch.

59. The delay locked loop as recited in claim 58, wherein the controlled switch comprises a transistor.

60. The delay locked loop as recited in claim 56, wherein the second delay line comprises a plurality of second delay units connected in series.

61. The delay locked loop as recited in claim 60, wherein each of the second delay units comprises:

a first logic element for delaying a received signal; and a second logic element for delaying an output of the first logic element.

62. The delay locked loop as recited in claim 56 further comprising:

a first shift register in communication with the first delay line; and a second shift register in communication with the second delay line, wherein the first shift register triggers a first shift-right signal in response to a first predetermined condition and triggers a first shift-left signal in response to a second predetermined condition, and wherein the second shift register is responsive to at least one of the shift-right signal and the shift-left signal.

63. The delay locked loop as recited in claim 62 further comprising:

a phase comparator coupled to the first shift register; and a delay monitor coupled to the phase comparator.

64. The delay locked loop as recited in claim 60, wherein each of the first delay units is adapted to delay the received signal by a first delay amount, each of the second delay units is adapted to delay the delayed signal by a second delay amount, and the second delay amount is greater than the first delay amount.

65. The delay locked loop as recited in claim 64, wherein the second delay amount is an integer multiple of the first delay amount.

66. The delay locked loop as recited in claim 65, wherein a total delay produced by activating all of the first delay units is less than the second delay amount.

67. The delay locked loop as recited in claim 62, wherein the second delay line comprises a plurality of second delay units, each of the first delay units is adapted to delay the received signal by a first delay amount, each of the second delay units is adapted to delay the delayed signal by a second delay amount, and the second delay amount is greater than the first delay amount.

68. The delay locked loop as recited in claim 67, wherein the first shift-right signal is produced when all of the first delay units are activated and a second shift-right signal is received at the first shift register.

69. The delay locked loop as recited in claim 68, wherein the first delay units are all deactivated when the second shift-right signal is received at the first shift register when all of the first delay units are activated.

70. The delay locked loop as recited in claim 68, wherein the first shift-left signal is produced when none of the first delay units are activated and a second shift-left signal is received at the first shift register.

71. The delay locked loop as recited in claim 70, wherein the first delay units are all activated when the second shift-left signal is received at the first shift register when none of the first delay units are activated.

72. The delay locked loop as recited in claim 67, wherein a first shift-right signal results in a delay increase of the first delay amount.

73. The delay locked loop as recited in claim 72, wherein a first shift-left signal results in a delay decrease of the first delay amount.

74. The delay locked loop as recited in claim 56, wherein the second delay line includes a plurality of second delay units, and a second delay unit is activated if all of the first delay units are activated and more delay is required.

75. For use in a semiconductor memory, a method for synchronizing an internal clock signal with an external clock signal comprising the steps of:

selectively adjusting a capacitance of a first delay line to delay the external clock signal to develop a delayed signal; and selectively delaying the delayed signal via a second delay line to develop the internal clock signal.

76. The method as recited in claim 75, wherein the delayed signal is not delayed relative to the received signal.

77. The method as recited in claim 75, wherein the step of selectively adjusting the capacitance of the first delay line is performed in first increments, each of the first increments corresponding to a first delay amount.

78. The method as recited in claim 77, wherein the step of selectively delaying the delayed signal is performed in second increments, each of the second increments corresponding to a second delay amount.

79. The method as recited in claim 77, wherein the second delay amount is greater than the first delay amount.

80. The method as recited in claim 77, wherein the second delay amount is an integer multiple of the first delay amount.

* * * * *